United States Patent
Barrenscheen

(10) Patent No.: US 7,425,914 B2
(45) Date of Patent: Sep. 16, 2008

(54) INTEGRATED CIRCUIT HAVING A SIGNAL CONVERTER

(75) Inventor: Jens Barrenscheen, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/627,170

(22) Filed: Jan. 25, 2007

(65) Prior Publication Data
US 2007/0176803 A1 Aug. 2, 2007

(30) Foreign Application Priority Data
Jan. 25, 2006 (DE) .................. 10 2006 003 566

(51) Int. Cl.
*H03M 1/12* (2006.01)
(52) U.S. Cl. ...................... 341/155; 341/120
(58) Field of Classification Search .............. 341/155, 341/120, 118, 139, 156, 164
See application file for complete search history.

(56) References Cited

U.S. PATENT DOCUMENTS

| 5,677,691 | A | * | 10/1997 | Hosticka et al. ............. 341/155 |
| 5,745,394 | A | * | 4/1998 | Tani ........................... 708/313 |
| 6,268,820 | B1 | * | 7/2001 | Sherry et al. ................ 341/155 |
| 6,522,274 | B1 | | 2/2003 | Amar et al. |
| 2003/0076250 | A1 | * | 4/2003 | Enochson et al. ........... 341/120 |

FOREIGN PATENT DOCUMENTS

DE 102 29 186 2/2004

* cited by examiner

*Primary Examiner*—Brian Young
(74) *Attorney, Agent, or Firm*—Dicke, Billig & Czaja, PLLC

(57) ABSTRACT

A method for operating a signal converter, and to an integrated circuit having a signal converter, in particular an analog-digital converter is disclosed. One embodiment includes a plurality of registers, wherein the signal converter is designed and equipped such that the function of the registers each can be selected variably, in particular by programming corresponding control registers controlling the function of corresponding registers.

23 Claims, 1 Drawing Sheet

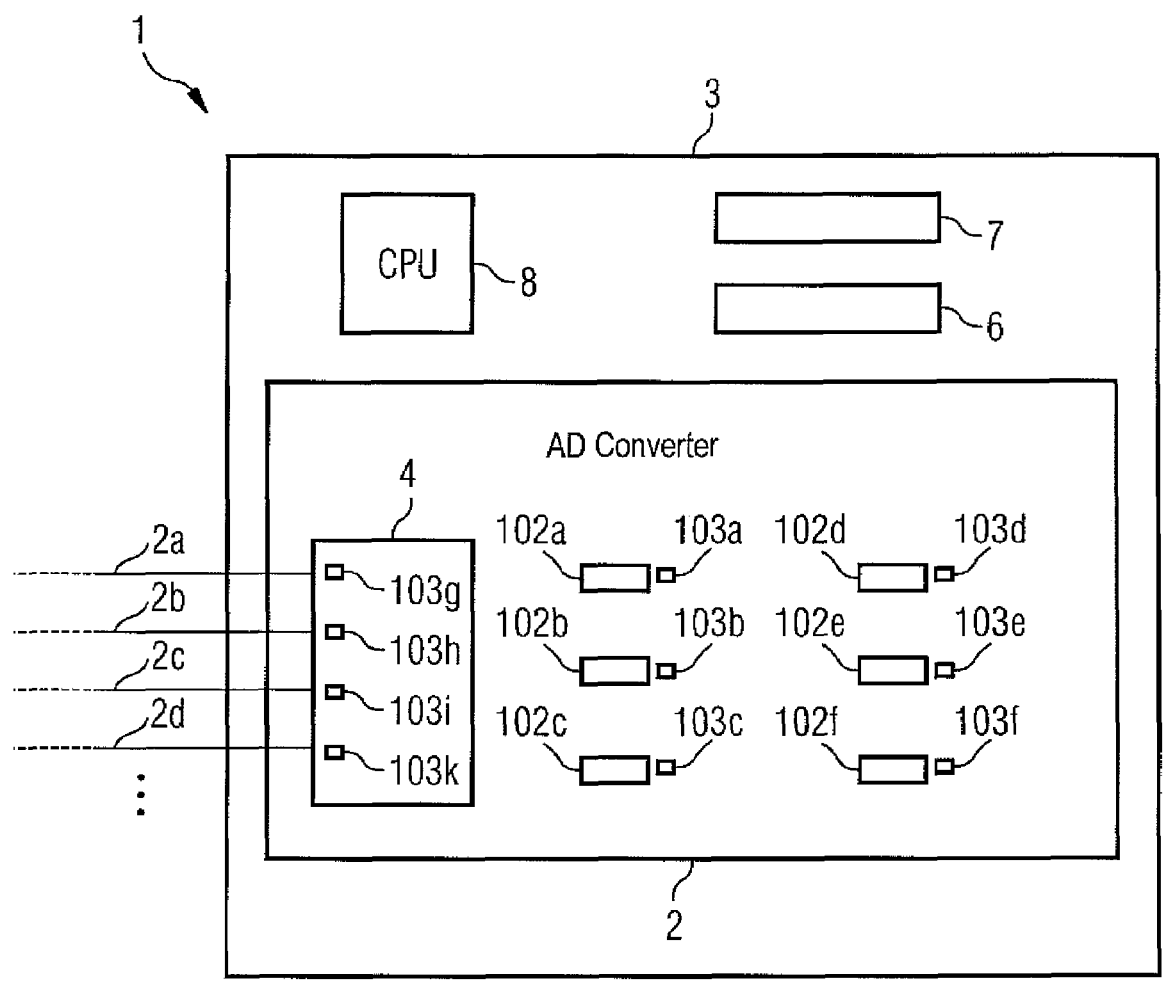

INTEGRATED CIRCUIT HAVING A SIGNAL CONVERTER

CROSS-REFERENCE TO RELATED APPLICATIONS

This Utility Patent Application claims priority to German Patent Application No. DE 10 2006 003 566.6 filed on Jan. 25, 2006, which is incorporated herein by reference.

BACKGROUND

Conventional microcontroller or microprocessor systems include one or a plurality of (central) control or processing units (Central Processing Units (CPUs), or CPU "cores") that are connected with one or a plurality of memories, e.g., a program and a data memory means ("program memory" and "data memory").

The memories may be provided on one and the same chip as the corresponding microcontroller or microprocessor (so-called "embedded" microcontroller or microprocessor system), or may alternatively also be provided separately.

The "program memory" includes the sequence of instructions to be processed by the CPU core(s), i.e. the program (and possibly additionally corresponding data constants to be used by the CPU core(s)).

In the "data memory", the variables—that are possibly to be modified in particular by the CPU core(s) during the execution of the program—may be stored.

Conventional microcontroller or microprocessor systems—e.g., systems that are used in the automotive field—frequently also include one or a plurality of signal converters, in particular analog-digital converters.

By an analog-digital converter, an analog input signal, e.g., a corresponding measurement voltage, may be converted to a digital numerical value that is "understandable" for the corresponding microcontroller or microprocessor processing unit.

Analog-digital converters may operate in accordance with a plurality of different converting methods, e.g., the parallel method, the weighing method, or the counting method, etc. (or also mixed forms thereof).

In the case of the parallel method, the input signal or the input voltage, respectively, is, by corresponding comparators, simultaneously compared with n different reference voltages, and it is determined between which two reference voltages the input voltage ranges. This way, the digital numerical value or the corresponding dual number, respectively, pertaining to the input signal may be determined in one single process. The relatively high switching effort is, however, of disadvantage since a relatively great number of comparators are needed.

In the case of the weighing method, other than with the parallel method, the digital numerical value pertaining to the input signal is not determined in one single process, but in several processes, wherein only one respective position of the corresponding dual number is determined per process. In so doing, the respectively highest dual number position is initially started with, and it is determined whether the input voltage is greater or smaller than the reference voltage assigned to the highest dual number position (which may in particular e.g., correspond to half the value of the corresponding maximum voltage). If the input voltage is smaller, the highest position is set to "0", otherwise to "1", and the reference voltage assigned to the highest dual number position is subtracted from the input voltage. Next, it is determined whether the input voltage or the remaining voltage obtained by the above-mentioned subtraction, respectively, is greater or smaller than the reference voltage assigned to the next-highest dual number position (which may in particular e.g., correspond to a quarter of the maximum voltage). If it is smaller, the next-highest position is set to "0", otherwise to "1", etc. In the case of the weighing method, a number of comparison processes and reference voltages corresponding to the number of positions of the dual number is thus required.

In the case of the counting method it is determined how often the reference voltage assigned to the lowest position of the dual number has to be added to obtain the input voltage. The number of processes necessary for determining the digital number value pertaining to the input voltage corresponds to the respective digital number value, i.e. the counting method is relatively little expensive, but relatively slow.

Conventional analog-digital converters may include several, different input channels via which the input voltages to be converted are supplied to the corresponding analog-digital converter.

For each input channel, a result register that is specifically assigned thereto may be provided, in which the digital number value determined for the respective input channel is stored. This results—in particular with a relatively high number of input channels—to a relatively high space required.

For these and other reasons, there is a need for the present invention.

SUMMARY

One embodiment provides a method for operating an integrated circuit having a signal converter, and to a signal converter. In one embodiment, the signal converter includes a plurality of registers, wherein the signal converter is designed and equipped such that the function of the registers each can be selected variably, and in one embodiment, by programming corresponding control registers controlling the function of corresponding registers.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic, exemplary representation of an electronic system, in particular a microcontroller or microprocessor system, having an analog-digital converter in accordance with an embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the invention provides an integrated circuit including a novel signal converter, in one embodiment, an analog-digital converter, and a novel method for operating a signal converter.

In accordance with one embodiment, there is provided a signal converter, in particular an analog-digital converter, having a plurality of registers, wherein the signal converter is designed and equipped such that the function of the registers each can be selected variably.

One or a plurality of variably programmable control registers may be provided for the variable selecting of the respective register function.

In one embodiment of the invention, a respective variably programmable control register that controls the function of the corresponding register may be assigned to each register for the variable selecting of the respective register function.

In accordance with a further embodiment of the invention there is provided a method for operating a signal converter, in particular an analog-digital converter, having a plurality of registers, wherein the method includes the process of:

programming the function of the registers.

The analog-digital converter (AD converter) 2 may—like in the present embodiment and as illustrated in FIG. 1—be provided on a corresponding microcontroller or microprocessor 3 (or a corresponding microcontroller or microprocessor chip), or alternatively on a separate chip.

The microcontroller or microprocessor 3 may include one or a plurality of (central) control or processing units 8 (Central Processing Unit 8 (CPU), or CPU "core") that are connected with one or a plurality of memories, e.g., a program memory 7 and a data memory 6.

The program and data memories 6, 7 may, in the present embodiment, e.g., be provided on one and the same chip as the corresponding microcontroller or microprocessor 3 (so-called "embedded" microcontroller or microprocessor system), or may alternatively also be provided separately.

The program memory 7 includes the sequence of instructions to be processed by the CPU(s) 8, i.e. the program (and possibly additionally corresponding data constants to be used by the CPU(s) 8) (i.e. program data).

Contrary to this, the variables—that are possibly to be modified in particular by the CPU(s) 8 during the execution of the program—may, for instance, be stored in the data memory 6 (or corresponding application data).

The data memory 6 may e.g., be formed by one or several RAMs (RAM=Random Access Memory or read write memory), in particular e.g., DRAMs (DRAM=Dynamic Random Access Memory), or SRAMs (SRAM=Static Random Access Memory).

An appropriate, non-volatile memory device, e.g., an EPROM (Erasable PROM) or EEPROM (Electrically Erasable PROM), in particular e.g., a flash EEPROM, may be used as program memory 7. Alternatively, a RAM, in particular e.g., a DRAM, may also be used as program memory 7.

The microcontroller or microprocessor 3 may, via one or a plurality of bus systems, be connected to one or a plurality of further system modules that is/are connected to the bus system(s) and communicate with each other via the bus system(s).

The microcontroller or microprocessor system 1 illustrated in FIG. 1 may, for instance, be used in a motor vehicle, e.g., for controlling distributed electrical systems (e.g., for controlling direct current motors and/or stepping motors for electric window lifts and side mirrors, for adjusting the lower-beam headlamp, for managing sensor information to control the air conditioning system and/or the seating position, etc.).

The microcontroller or microprocessor 3 may, for instance, be an 8-bit, 16-bit, or 32-bit microcontroller, or any other microcontroller or microprocessor or DSP.

By the analog-digital converter 2, an analog signal—transmitted, for instance via an analog line, and originating e.g., from one of the above-mentioned system modules, and supplied to the analog-digital converter 2 via a corresponding input channel 2a, 2b, 2c, 2d—,e.g., a corresponding measurement voltage, may be converted to a digital numerical value that is "understandable" for the microcontroller or microprocessor 3 or its CPU 8, respectively.

For converting the input signal to a corresponding digital numerical value, the analog-digital converter 2 includes a signal converter 4 that operates, for instance, in accordance with the parallel method, the weighing method, or the counting method, etc., or any other method.

As will be explained in more detail in the following, a plurality of (result) registers 102a, 102b, 102c, 102d, 102e, 102f (e.g., more than three, more than seven, more than fifteen, or more than twenty, etc. registers 102a, 102b, 102c, 102d, 102e, 102f) are provided for storing the digital numerical values generated by the signal converter 4, and/or—each flexibly configurable—for one or several further functions that will be explained in more detail in the following.

For the flexible configuration of the function of the registers 102a, 102b, 102c, 102d, 102e, 102f (for use each as result register, and/or as register for one or several of the above-mentioned further functions, etc.), one or several control registers 103a, 103b, 103c, 103d, 103e, 103f—adapted to be programmed in correspondence with the respectively desired configuration—are provided.

To each configurably designed register 102a, 102b, 102c, 102d, 102e, 102f a respective control register 103a, 103b, 103c, 103d, 103e, 103f controlling the configuration of the respective register 102a, 102b, 102c, 102d, 102e, 102f may be assigned. Alternatively, the function of the control registers 103a, 103b, 103c, 103d, 103e, 103f may also be assumed by one or several control registers that each control the configuration of several ones of the registers 102a, 102b, 102c, 102d, 102e, 102f centrally.

In alternative embodiments, not all of the above-mentioned registers 102a, 102b, 102c, 102d, 102e, 102f are designed to be configured flexibly, but only part of the registers 102a, 102b, 102c, 102d, 102e, 102f, wherein only to those registers 102a, 102b, 102c, 102d, 102e, 102f that are designed configurable a corresponding control register 103a, 103b, 103c, 103d, 103e, 103f is assigned.

As results from FIG. 1, the analog-digital converter 2 includes a plurality of (e.g., more than three, more than five, more than ten, etc., e.g., 8 or 16) different input channels 2a, 2b, 2c, 2d via which the input voltages to be converted are supplied to the analog-digital converter 2 or to the signal converter 4, respectively.

In the present embodiment—as will be explained in more detail in the following—it is, for each input channel 2a, 2b, 2c, 2d, by a control register 103g, 103h, 103i, 103k ("channel control register") that is assigned to the corresponding input channel 2a, 2b, 2c, 2d, possible to flexibly configure in which of the above-mentioned (result) registers 102a, 102b, 102c, 102d, 102e, 102f the digital numerical value determined for a particular input channel 2a, 2b, 2c, 2d by the signal converter 4 is to be stored (or the digital numerical value determined for an input voltage present at the respective input channel 2a, 2b, 2c, 2d, respectively). For this purpose, a respective pointer value pointing to the respective result register 102a, 102b, 102c, 102d, 102e, 102f may be stored in the respective control register 103g, 103h, 103i, 103k.

Alternatively, the function of the control registers 103g, 103h, 103i, 103k may also be assumed by a central control register controlling the respective assignment between the input channels and the result registers 102a, 102b, 102c, 102d, 102e, 102f.

For instance, a digital numerical value determined for a first input channel 2a or the input voltage present there, respectively, may—flexibly configurable by the control register(s) 103g, 103h, 103i, 103k—either be stored in the (result) register 102a, and/or in the register 102b, and/or in the register 102c, and/or in the register 102d, and/or in the register 102e, and/or in the register 102f, etc.

Correspondingly, a digital numerical value determined for a second input channel 2b may also—flexibly configurable—either be stored in the (result) register 102a, and/or in the register 102b, and/or in the register 102c, and/or in the register 102d, and/or in the register 102e, and/or in the register 102f, etc.; the corresponding also applies for a third, a fourth, and possibly for one or several further input channels 2c, 2d, etc., or for the digital numerical values determined for them, respectively.

The respective configuration of the input channels 2a, 2b, 2c, 2d and of the registers 102a, 102b, 102c, 102d, 102e, 102f (with respect to the assignment of a respective register 102a, 102b, 102c, 102d, 102e, 102f to a particular input channel 2a, 2b, 2c, 2d, and/or with respect to the fulfillment of the above-mentioned further functions by the registers 102a, 102b, 102c, 102d, 102e, 102f, etc.) can—as will be explained in more detail in the following—be flexibly adapted or changed during the operation of the analog-digital converter 2 by an appropriate programming of the control registers 103a, 103b, 103c, 103d,103e, 103f or 103g, 103h, 103i, 103k, respectively; alternatively or additionally, the programming of the control registers 103a, 103b, 103c, 103d, 103e, 103f or 103g, 103h, 103i, 103k, respectively, i.e. the selection of the respective configuration of the analog-digital converter 2, may also be performed prior to the actual working operation of the analog-digital converter 2.

Due to the flexible configurability of the analog-digital converter 2 it may—e.g., with a respectively different configuration—optionally be used in several different microcontrollers or microprocessors of different types, e.g., identically designed, but differently configured analog-digital converters 2, optionally in an 8-bit, or a 16-bit, or a 32-bit microcontroller, etc.

By the control register(s) 103a, 103b, 103c, 103d, 103e, 103f or 103g, 103h, 103i, 103k, respectively, the number of registers 102a, 102b, 102c, 102d, 102e, 102f used as result registers for storing the digital numerical values generated by the signal converter 4, and for one or several ones of the above-mentioned further functions may, for instance, also be configured flexibly (wherein e.g., in an 8-bit microcontroller e.g., 4 registers of the above-mentioned registers 102a, 102b, 102c, 102d, 102e, 102f may be used as result registers, and the remaining registers of the registers 102a, 102b, 102c, 102d, 102e, 102f for one or several ones of the above-mentioned further functions (or not at all), and e.g., in a 16-bit microcontroller e.g., 8 registers of the above-mentioned registers 102a, 102b, 102c, 102d, 102e, 102f may be used as result registers, and the remaining registers of the registers 102a, 102b, 102c, 102d, 102e, 102f for one or several ones of the above-mentioned further functions (or not at all), and e.g., in a 32-bit microcontroller e.g., more than 8 or more than 12 registers of the above-mentioned registers 102a, 102b, 102c, 102d, 102e, 102f may be used as result registers, etc.).

The number of registers 102a, 102b, 102c, 102d, 102e, 102f configured as result registers by the above-mentioned control registers 103a, 103b, 103c, 103d, 103e, 103f or 103g, 103h, 103i, 103k, respectively, i.e. used for the direct storing of digital numerical values determined by the signal converter 4, may be smaller than the number of the input channels 2a, 2b, 2c, 2d that are used actively, i.e. are provided for receiving input signals to be converted.

Thus, the number of registers 102a, 102b, 102c, 102d, 102e, 102f to be provided altogether may be reduced.

By the control registers 103a, 103b, 103c, 103d, 103e, 103f or 103g, 103h, 103i, 103k, respectively, the analog-digital converter 2 may, for instance, be configured such that several (e.g., two, three, or more) input channels 2a, 2b, 2c, 2d participate in an autoscan, and that, for the input channels 2a, 2b, 2c, 2d participating in the autoscan, the digital numerical values determined for these input channels 2a, 2b, 2c, 2d by the signal converter 4 are written—correspondingly delayed—into one and the same result register 102a, 102b, 102c, 102d, 102e, 102f jointly used by the autoscan input channels 2a, 2b, 2c, 2d.

With the input channels 2a, 2b, 2c, 2d participating in the autoscan—and arbitrarily selectable by a corresponding configuration of the control registers 103a, 103b, 103c, 103d, 103e, 103f or 103g, 103h, 103i, 103k, respectively—, the signal converter 4 scans, in regular time intervals—for different input channels 2a, 2b, 2c, 2d with a respective relative delay—the analog input signal that is present at the respective input channel 2a, 2b, 2c, 2d participating in the autoscan, and the digital numerical value determined for the input signal is stored in the above-mentioned register 102a, 102b, 102c, 102d, 102e, 102f that is jointly used by the autoscan input channels 2a, 2b, 2c, 2d.

One or several registers 102a, 102b, 102c, 102d, 102e, 102f—that can arbitrarily be selected by a corresponding configuration of the control registers 103a, 103b, 103c, 103d, 103e, 103f or 103g, 103h, 103i, 103k, respectively—may be operated in a wait-for-read mode.

In a register 102a, 102b, 102c, 102d, 102e, 102f operated in the wait-for-read mode, the signal converter 4 performs an analog-digital conversion for the assigned input channel(s) 2a, 2b, 2c, 2d, and the determined (new) digital numerical value is stored in the corresponding register 102a, 102b, 102c, 102d, 102e, 102f not before the (old) digital numerical value that has last—i.e. as a result of the previous analog-digital conversion—been stored in the corresponding register 102a, 102b, 102c, 102d, 102e, 102f has been read out (e.g., by the CPU 8 or the program stored on the above-mentioned memory 6, 7, or—without the participation of the CPU 8—by an appropriate DMA (Direct Memory Access) mechanism, etc.).

The registers 102a, 102b, 102c, 102d, 102e, 102f used by input channels 2a, 2b, 2c, 2d participating in the autoscan for storing corresponding digital numerical values—in particular the above-mentioned register 102a, 102b, 102c, 102d, 102e, 102f jointly used by a plurality of autoscan input channels 2a, 2b, 2c, 2d—may be operated in the wait-for-read mode.

By that, the danger of a loss of data of digital numerical values generated during autoscan can be reduced. Furthermore, the microcontroller or microprocessor system 1 can be utilized more efficiently since the corresponding digital numerical values only have to be read out from the corresponding register 102a, 102b, 102c, 102d, 102e, 102f when there is sufficient time available.

Since the respective registers 102a, 102b, 102c, 102d, 102e, 102f operated in a wait-for-read mode are arbitrarily freely selectable, i.e. one or several further registers 102a, 102b, 102c, 102d, 102e, 102f may continue to be operated in a normal mode, it can be prevented that, by a register 102a, 102b, 102c, 102d, 102e, 102f operated in the wait-for-read mode—in which digital numerical values with a corresponding low priority are written, e.g., the above-mentioned autoscan numerical values,—the storing of numerical values with corresponding higher priority is prevented or blocked. This is because the digital numerical values of higher priority may be written in a register 102a, 102b, 102c, 102d, 102e, 102f operated in the normal mode instead of a register 102a, 102b, 102c, 102d, 102e, 102f operated in the wait-for-read mode.

Due to the above-explained flexible configurability of the analog-digital converter 2, in particular the free assignability of input channels 2a, 2b, 2c, 2d to result registers 102a, 102b, 102c, 102d, 102e, 102f, an efficient use of DMA (Direct Memory Access) mechanisms can also be achieved.

For instance, by the control registers 103a, 103b, 103c, 103d, 103e, 103f or 103g, 103h, 103i, 103k, respectively, the analog-digital converter 2 may—e.g., during (working) operation, and/or prior to the actual working operation of the analog-digital converter 2—be configured such that for an input channel 2a, 2b, 2c, 2d for which a DMA (Direct Memory Access) access is to be enabled, the respective digital numerical value determined for this input channel 2a, 2b, 2c, 2d by the signal converter 4 is written in a predetermined result register 102a, 102b, 102c, 102d, 102e, 102f that is used as DMA register.

One and the same result register 102a, 102b, 102c, 102d, 102e, 102f is—jointly—used as DMA register by a plurality of or all input channels 2a, 2b, 2c, 2d (or, alternatively, only a small number of registers, e.g., two). Independently of the input channel 2a, 2b, 2c, 2d, whenever a DMA (Direct Memory Access) access is to be performed, the digital numerical value determined for a corresponding input channel 2a, 2b, 2c, 2d by the signal converter 4 is written in one and the same result register 102a, 102b, 102c, 102d, 102e, 102f (or, alternatively, in one of the two above-mentioned DMA registers, etc.).

Thus, the number of DMA channels to be provided may be kept small (e.g., the number of DMA channels may—if only one register 102a, 102b, 102c, 102d, 102e, 102f is used as DMA register—be reduced to one single DMA channel (alternatively:—in the case of two registers 102a, 102b, 102c, 102d, 102e, 102f that are used as DMA registers—to two DMA channels, etc.)).

DMA (Direct Memory Access) accesses are in general characterized by a relatively simple address arithmetic, so that DMA accesses can be performed with corresponding efficiency for ordered addresses only. This is the case with the present embodiment since one single, specified address that can be configured in the above-mentioned manner may be assigned to the above-mentioned register 102a, 102b, 102c, 102d, 102e, 102f that is—solely—acting as DMA register (or—alternatively—in the case of two registers 102a, 102b, 102c, 102d, 102e, 102f that are acting as DMA registers, two corresponding, specified addresses that can be configured in the above-mentioned manner, etc.).

Reading out the above-mentioned register 102a, 102b, 102c, 102d, 102e, 102f jointly used by several input channels 2a, 2b, 2c, 2d participating in the autoscan for storing corresponding digital numerical values, a corresponding DMA mechanism is used—alternatively, the corresponding digital numerical value may, for instance, also be read out by the CPU 8 or the program stored on the above-mentioned memory 6, 7, respectively, or in any other manner.

One or several registers 102a, 102b, 102c, 102d, 102e, 102f—that can arbitrarily be selected by a corresponding configuration of the control registers 103a, 103b, 103c, 103d, 103e, 103f or 103g, 103h, 103i, 103k, respectively—(e.g., the register 102d, etc.) may be operated such that it or they—along with one or several further ones of the registers 102a, 102b, 102c, 102d, 102e, 102f (e.g., the register 102a, etc.)—form a FIFO (First-In-First-Out) memory structure.

A register operated for this purpose in a FIFO (First-In-First-Out) mode by a corresponding configuration of the assigned control register 103d (e.g., the register 102d) does not receive the digital numerical to the stored in the register 102d directly from the signal converter 4, but from a register 102a, 102b, 102c, 102d, 102e, 102f (e.g., the register 102a) that can arbitrarily be selected by a corresponding configuration of the assigned control register 103d—along with which the above-mentioned FIFO structure is formed.

The digital numerical value determined for an—arbitrarily selectable—input channel 2a, 2b, 2c, 2d by analog-digital conversion by the signal converter 2 is then initially stored in the first element of the above-mentioned FIFO structure, e.g., in the register 102a, and this value is read out from the above-mentioned register 102d that is operated in the FIFO mode and forms the second element of the FIFO structure, and stored there, etc., etc.—in the first element of the FIFO structure, a new digital numerical value determined by the signal converter 2 may then already be stored.

By the registers 102a, 102b forming the FIFO structure, a multi-stage memory is thus formed.

The signal converter 2 may then be operated with a relatively high, in particular maximum conversion rate for a relatively short duration, and store the determined digital numerical values directly in the register 102a—which is correspondingly quickly emptied by the register 102d—(wherein, during the above-mentioned relatively short duration in which the signal converter 2 is operated with maximum conversion rate, a number of digital numerical values is generated which, for instance, corresponds to the number of registers 102a, 102d in the above-mentioned FIFO structure).

The digital numerical value stored in the last element of the FIFO structure, e.g., in the above-mentioned register 102d (or a further register)—FIFO output register—may be read out by a corresponding DMA mechanism, and/or in any other manner, e.g., by the CPU 8 or the program stored on the above-mentioned memory 6, 7, respectively. The digital numerical values stored in the remaining elements, e.g., the register 102a of the FIFO structure, are additionally, e.g., sequentially, also read out via the FIFO output register by the DMA mechanism or by the CPU 8, respectively. The reading out by the corresponding DMA mechanism and/or the CPU 8 may be performed at a substantially minor rate than the rate, in particular maximum conversion rate, at which the signal converter 2 has generated the corresponding digital numerical values stored in the elements of the FIFO structure.

By that—even if the DMA or CPU data reading rate is smaller than the maximum conversion rate of the signal converter 2—the input signal present at an input channel 2a, 2b, 2c, 2d, e.g., a corresponding measurement voltage, can be scanned at maximum conversion rate of the signal converter 2, i.e. successively in short intervals, and the determined voltage values (e.g., two corresponding, successive voltage values) may be related to each other.

The registers 102a, 102d, etc. forming the FIFO structure are arranged directly adjacent to each other with respect to physics and/or address.

The analog-digital converter 2 may also include two or a plurality of arithmetic operation elements, e.g., one or a plurality of addition elements, subtraction elements, multiplication elements, etc. (not illustrated).

By that, it may be achieved that the digital numerical values stored in two or more registers 102a, 102b, 102c, 102d, 102e, 102f—that can be selected arbitrarily by a corresponding configuration of the control registers 103a, 103b, 103c, 103d, 103e, 103f or 103g, 103h, 103i, 103k, respectively (or corresponding further control registers assigned to the arithmetic operation elements) are subjected to the respectively desired arithmetic operations, e.g., are added (or subtracted, or multiplied, etc.).

The digital numerical value determined as a result or intermediate result, respectively, of the corresponding arithmetic operation, e.g., addition, may stored in a register 102a, 102b, 102c, 102d, 102e, 102f that can arbitrarily be selected by a corresponding configuration of the control registers 103a, 103b, 103c, 103d, 103e, 103f or 103g, 103h, 103i, 103k, respectively.

A register 102a, 102b, 102c, 102d, 102e, 102f operated for this purpose in a corresponding mode by a corresponding configuration of the assigned control register thus does not receive the respective digital numerical value to be stored directly from the signal converter 4, but from a register 102a, 102b, 102c, 102d, 102e, 102f or arithmetic operation element, respectively, that can arbitrarily be selected by a corresponding configuration of the assigned control register.

One or several ones of the digital numerical values determined in the above-mentioned manner and stored as intermediate result in one or several ones of the above-mentioned registers 102a, 102b, 102c, 102d, 102e, 102f, and/or one or several digital numerical values stored in one or several further ones of the above-mentioned registers 102a, 102b, 102c, 102d, 102e, 102f may be subjected to one or several further arithmetic operations by the above-mentioned arithmetic operation elements (wherein the corresponding registers and/or arithmetic operation elements can—again—arbitrarily be selected by a corresponding configuration of the control registers 103a, 103b, 103c, 103d, 103e, 103f or 103g, 103h, 103i, 103k, respectively (or of the above-mentioned further control registers), etc., etc.

The digital numerical value determined as end result of the above-mentioned arithmetic operation(s) may be stored in a register 102a, 102b, 102c, 102d, 102e, 102f ("end result register") that can arbitrarily be selected by a corresponding configuration of the control registers 103a, 103b, 103c, 103d, 103e, 103f or 103g, 103h, 103i, 103k, respectively.

The end result may be read out from the register storing the end result by a register operated—by a corresponding configuration of the assigned control register—in the FIFO (First-In-First-Out) mode, and be stored in this register.

The digital numerical value stored in the register operating in the FIFO mode (or in the above-mentioned end result register) may be read out by a corresponding DMA mechanism, and/or in any other manner, e.g., by the CUP 8 or the program stored on the above-mentioned memory 6, 7, respectively.

By one or several ones of the arithmetic operations performed by the arithmetic operation elements, the digital numerical values stored in the registers 102a, 102b, 102c, 102d, 102e, 102f may be subjected to a digital filtering or to first partial processes of a digital filtering, respectively.

By performing the above-mentioned arithmetic operations or the filtering, respectively, a corresponding data reduction can be achieved, e.g., by averaging.

By that, it is possible to scan, in short successive time intervals, e.g., the maximum conversion rate of the signal converter 2, the input signal present at one or several input channels 2a, 2b, 2c, 2d, e.g., a corresponding measuring voltage, and to further process it within the analog-digital converter 2—in particular at a rate that is higher than the maximum DMA or CPU data reading rate.

A specific address may be assigned to each of the above-mentioned control registers 103a, 103b, 103c, 103d, 103e, 103f or 103g, 103h, 103i, 103k, respectively (and/or the above-mentioned further control registers), so that the control registers 103a, 103b, 103c, 103d, 103e, 103f or 103g, 103h, 103i, 103k, respectively (and/or the above-me further control registers) may be written with corresponding control data, i.e. may be programmed or configured, respectively, by applying corresponding address, control, and data signals to the above-mentioned bus system(s).

To each of the above-mentioned control registers 103a, 103b, 103c, 103d, 103e, 103f or 103g, 103h, 103i, 103k, respectively (and/or the above-mentioned further control registers) a corresponding state machine may be assigned which is, by the control data stored in the corresponding control register 103a, 103b, 103c, 103d, 103e, 103f or 103g, 103h, 103i, 103k, respectively, controlled such that the register 102a, 102b, 102c, 102d, 102e, 102f assigned to the corresponding control register 103a, 103b, 103c, 103d, 103e, 103f or 103g, 103h, 103i, 103k, respectively, is—for fulfilling the respectively selected one of the above-mentioned functions—operated in the respectively programmed manner.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a signal converter having a plurality of registers, wherein the signal converter is configured such that the function of the registers each can be selected variably;
   wherein the function of one or several ones of the registers can be selected such that it or they store a digital numerical value that is stored in one or several further ones of the registers, and
   wherein a variably selectable FIFO memory structure is formed by the register(s) and the further register(s).

2. The circuit of claim 1, comprising where the signal converter is an analog to digital signal converter.

3. The circuit according to claim 1, comprising:
   one or more variably programmable control registers configured for variable selection of a respective register function.

4. The circuit according to claim 3, comprising wherein a respective variably programmable control register controlling the function of the corresponding register is assigned to each register for the variable selection of the respective register function.

5. The circuit according to claim 1, comprising wherein the function of one or several ones of the registers can be selected such that the register stores a digital numerical value determined from an analog input signal by the signal converter.

6. The circuit according to claim 5, comprising:
a plurality of input channels, and comprising wherein the function of one or several one of the registers can be selected such that it or they store a digital numerical value determined by the signal converter from an analog input signal that is present at a variably selectable input channel.

7. The circuit according to claim 6, comprising wherein the function of at least one of the registers can be selected such that it stores digital numerical values determined by the signal converter from analog input signals that are present at a plurality of different variably selectable input channels.

8. The circuit according to claim 1, comprising wherein the function of one or several ones of the registers can be selected such that it or they store a digital numerical value determined by one or a plurality of variably selectable arithmetic operation elements.

9. An integrated circuit comprising:
a signal converter having a plurality of registers, wherein the signal converter is configured such that the function of the registers each can be selected variably,
wherein the function of one or several ones of the registers can be selected such that it or they store a digital numerical value determined by one or a plurality of variably selectable arithmetic operation elements, and
wherein the function of the arithmetic operation element(s) can be selected such that it or they use, for performing the respective arithmetic operation, a digital numerical value that is stored in a variably selectable register of the registers.

10. The circuit according to claim 9, comprising wherein a digital filtering or a partial process of a digital filtering, respectively, of the digital numerical value stored in the variably selectable register is achieved by the arithmetic operation elements.

11. A system comprising:
an analog to digital signal converter having a plurality of registers, wherein the signal converter is configured such that the function of the registers each can be selected variably;
a control system coupled to the signal converter, configured such that the function of one or several ones of the registers is selected such that the register stores a digital numerical value determined from an analog input signal by the signal converter; and
wherein a variable selectable FiFo memory structure is formed by the one or several ones of the registers.

12. The system of claim 11, comprising where the control system comprising an automotive control system and includes a processor.

13. The system according to claim 11, comprising:
one or more variably programmable control registers configured for variable selection of a respective register function.

14. The system according to claim 13, comprising wherein a respective variably programmable control register controlling the function of the corresponding register is assigned to each register for the variable selection of the respective register function.

15. The system according to claim 11, comprising:
a plurality of input channels, and comprising wherein the function of one or several ones of the registers can be selected such that it or they store a digital numerical value determined by the signal converter from an analog input signal that is present at a variably selectable input channel.

16. An analog-digital signal converter comprising:
a plurality of registers wherein the signal converter is configured such that the function of the registers each can be selected variably;
wherein the function on one or several ones of the registers can be selected such that it or they store a digital numerical value that is stored in one or several further ones of the registers, and
wherein a variably selectable FIFO memory structure is formed by the register(s) and the further register(s).

17. A signal converter comprising:
a plurality of registers wherein the signal converter is configured such that the function of the registers each be selected variably;
wherein the function of one or several ones of the registers can be selected such that it or they store a digital numerical value determined by one or a plurality of variably selectable arithmetic operation elements,
wherein the function of the arithmetic operation element(s) can be selected such that it or they use, for performing the respective arithmetic operation, a digital numerical value that is stored in a variably selectable register of the registers, and
wherein a digital filtering or a partial process of a digital filtering, respectively, of the digital numerical value stored in the variably selectable register is achieved by the arithmetic operation elements.

18. An integrated circuit comprising:
a signal converter having a plurality of registers, wherein the signal converter is configured such that the function of at least one of the registers can be variably selected such that it selectively stores either a digital numerical value determined from an analog input signal by the signal converter or instead stores a digital numerical value corresponding to or derived from a digital numerical value stored in a further one of the registers.

19. The signal converter according to claim 16, comprising wherein one or several variably programmable control registers are provided for the variable selection of the respective register function.

20. The signal converter according to claim 16, comprising wherein a respective variably programmable control register controlling the function of the corresponding register is assigned to each register for the variable selection of the respective register function.

21. The signal converter according to claim 16, comprising wherein the function of one or several ones of the registers can be selected such that it or they store a digital numerical value determined from an analog input signal by the signal converter.

22. The signal converter according to claim 21, comprising a plurality of input channels, and comprising wherein the function of one or several ones of the registers can be selected such that it or they store a digital numerical value determined by the signal converter from an analog input signal that is present at a variably selectable input channel.

23. The signal converter according to claim 22, comprising wherein the function of at least one of the registers can be selected such that it stores digital numerical values determined by the signal converter from analog input signals that are present at a plurality of different variably selectable input channels.

* * * * *